US006653170B1

United States Patent
Lin

(10) Patent No.: US 6,653,170 B1
(45) Date of Patent: Nov. 25, 2003

(54) SEMICONDUCTOR CHIP ASSEMBLY WITH ELONGATED WIRE BALL BONDED TO CHIP AND ELECTROLESSLY PLATED TO SUPPORT CIRCUIT

(76) Inventor: Charles W. C. Lin, 34 Pinewood Grove, Singapore (SG), 738290

( * ) Notice: Subject to any disclaimer, the term of this patent is extended or adjusted under 35 U.S.C. 154(b) by 69 days.

(21) Appl. No.: 09/777,533

(22) Filed: Feb. 6, 2001

(51) Int. Cl.[7] .................. H01L 21/44; H01L 21/48; H01L 21/50
(52) U.S. Cl. ................................ 438/117; 438/617
(58) Field of Search ............................ 438/117, 118, 438/119, 107, 612, 613, 617

(56) References Cited

U.S. PATENT DOCUMENTS

| 4,442,967 A | 4/1984 | van de Pas et al. ........ 228/159 |
|---|---|---|
| 4,661,192 A | 4/1987 | McShane .................... 156/292 |
| 4,717,066 A | 1/1988 | Goldenberg et al. ........ 228/179 |
| 4,750,666 A | 6/1988 | Neugebauer et al. ....... 228/160 |
| 4,807,021 A | 2/1989 | Okumura ..................... 357/75 |
| 4,925,083 A | 5/1990 | Farassat et al. ............. 228/102 |
| 4,937,653 A | 6/1990 | Blonder et al. ............... 357/68 |
| 4,955,523 A | 9/1990 | Calomagno et al. ........ 228/179 |
| 4,970,571 A | 11/1990 | Yamakawa et al. ........... 357/71 |
| 4,984,358 A | 1/1991 | Nelson ........................ 29/830 |
| 5,014,111 A | 5/1991 | Tsuda et al. ................... 357/68 |
| 5,060,843 A | 10/1991 | Yasuzato et al. ............ 228/179 |
| 5,074,947 A | 12/1991 | Estes et al. ................ 156/307.3 |
| 5,090,119 A | 2/1992 | Tsuda et al. .................. 29/843 |
| 5,106,461 A | 4/1992 | Volfson et al. .............. 205/125 |
| 5,116,463 A | 5/1992 | Lin et al. ..................... 156/653 |
| 5,137,845 A | 8/1992 | Lochon et al. .............. 437/183 |
| 5,167,992 A | 12/1992 | Lin et al. ..................... 427/437 |
| 5,172,851 A | 12/1992 | Matsushita et al. ......... 228/179 |
| 5,196,371 A | 3/1993 | Kulesza et al. ............. 437/183 |
| 5,209,817 A | 5/1993 | Ahmad et al. ............... 156/643 |
| 5,237,130 A | 8/1993 | Kulesza et al. ............. 174/260 |
| 5,260,234 A | 11/1993 | Long ........................... 437/203 |
| 5,261,593 A | 11/1993 | Casson et al. ........... 228/180.22 |

(List continued on next page.)

FOREIGN PATENT DOCUMENTS

| EP | 0 718 882 A1 | 6/1996 | ......... H01L/23/057 |
|---|---|---|---|
| WO | WO 97/38563 | 10/1997 | ............ H05K/1/03 |
| WO | WO 99/57762 | 11/1999 | ........... H01L/23/48 |

OTHER PUBLICATIONS

U.S. application Ser. No. 09/120,408, filed Jul. 22, 1998, entitled "Flip Chip Assembly With Via Interconnection".
U.S. application Ser. No. 09/465,024, filed Dec. 16, 1999, entitled "Bumpless Flip Chip Assembly With Solder Via".
U.S. application Ser. No. 09/464,562, filed Dec. 16, 1999, entitled "Bumpless Flip Chip Assembly With Strips and Via–Fill".
U.S. application Ser. No. 09/464,561, filed Dec. 16, 1999, entitled "Bumpless Flip Chip Assembly With Strips–In–Via And Plating".
U.S. application Ser. No. 09/643,212, filed Aug. 22, 2000, entitled "Semiconductor Chip Assembly With Simultaneously Electroplated Contact Terminal and Connection Joint".

(List continued on next page.)

*Primary Examiner*—Olik Chaudhuri
*Assistant Examiner*—Khiem Nguyen
(74) *Attorney, Agent, or Firm*—David M. Sigmond

(57) ABSTRACT

A semiconductor chip assembly includes a semiconductor chip attached to a support circuit. The chip includes a conductive pad and the support circuit includes a conductive trace. An elongated wire that electrically connects the pad to the trace is attached to the pad by a wire bond and attached to the trace by a plated connection joint. Preferably, an electrically conductive path between and in contact with the pad and the trace includes the elongated wire and excludes solder and conductive adhesive. A method of manufacturing the assembly includes forming the wire bond using thermocompression or thermosonic ball bonding and then forming the connection joint using electroless plating.

90 Claims, 14 Drawing Sheets

U.S. PATENT DOCUMENTS

| | | | |
|---|---|---|---|
| 5,275,330 A | 1/1994 | Isaacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,336,269 B1 * | 1/2002 | Eldridge et al. | 29/885 |

OTHER PUBLICATIONS

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before And After Chip Attachment".

U.S. application Ser. No. 09/687,619, filed Oct. 13, 2000, entitled "Method Of Connecting A Conductive Trace To A Semiconductor Chip".

U.S. application Ser. No. 09/738,667, filed Dec. 15, 2000, entitled "Semiconductor Chip Assembly With Bumped Molded Substrate".

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips And Via–Fill".

U.S. application Ser. No. 09/464,561, filed Dec. 16, 1999, entitled "Bumpless Flip Chip Assembly With Strips–In–Via And Plating".

* cited by examiner

SEMICONDUCTOR CHIP ASSEMBLY WITH ELONGATED WIRE BALL BONDED TO CHIP AND ELECTROLESSLY PLATED TO SUPPORT CIRCUIT

BACKGROUND OF THE INVENTION

1. Field of the Invention

The present invention relates generally to a semiconductor chip assembly, and more particularly to a semiconductor chip assembly in which a semiconductor chip is mechanically and electrically connected to a support circuit.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive filler particles in polymer binders have been used in place of solder. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. As a result, bumpless techniques have been developed that combine wire bonding with a flip-chip arrangement. Several of these techniques are described below.

U.S. Pat. No. 4,442,967 discloses a method of providing a raised contact portion on a microcircuit. A wire ball is formed on a wire end by applying thermal energy, the wire ball is pressed against a contact area on the microcircuit using thermocompression or thermosonic wire bonding to form a ball bond, a weakened area of the wire is created near the ball bond, and the wire is severed at the weakened area to provide a raised contact portion on the contact area. The contact portions thus obtained are relatively simple and economical compared to electroplated bumps. Thereafter, the contact portions are electrically connected to a support circuit by disposing a conductive adhesive between the contact portions and bond sites in a flip-chip arrangement.

U.S. Pat. No. 4,661,192 discloses a method of bonding chips to support frames by providing ball bonds on chip pads using wire bonding, planarizing the ball bonds, coating the planarized ball bonds with conductive epoxy, and then registering and bonding the conductive epoxy to corresponding conductive patterns on support frames. Care must be taken to ensure that the epoxy does not flow excessively and cause shorting between the leads.

U.S. Pat. No. 4,955,523 discloses a technique for interconnecting electronic components in which interconnection wires are wire bonded to contacts on an integrated circuit chip, an insulating material is applied to the surface of the chip to encapsulate the bonds between the wires, the wires are aligned with solder pools located in recesses of an IC chip carrier, heat is applied to fuse the solder, and the wires are inserted into the fused solder.

U.S. Pat. No. 5,764,486 discloses interconnecting a flip-chip integrated circuit to a substrate using wire bumps. The wire bumps formed on the chip include a pointed tip, a stub portion and a ball portion. The pointed tips are brought in ohmic contact with conductors on the substrate. Thereafter, an adhesive material is disposed between the substrate and the chip and cured using ultraviolet light. Alternatively, a spring system provides compressive force between the substrate and the chip.

U.S. Pat. No. 5,813,115 discloses a method of mounting a semiconductor chip to a wiring substrate using conductive adhesive or solder. The method includes feeding a wire through a capillary, fusing an end of the wire to form a ball, pressing and bonding the ball against a chip pad, cutting the wire so that a remaining portion protrudes above the ball, pressing the protruding contact against a shaping platform coated with conductive adhesive to adjust the height of the protruding contact and transfer conductive adhesive onto the protruding contact, and bonding the protruding contact to a conductor on the wiring substrate using the transferred conductive adhesive. Alternatively, the protruding contact is pressed against a solder coated conductor on the wiring substrate and the solder is heated to bond the protruding contact to the conductor.

U.S. Pat. No. 5,863,816 discloses bonding conductive wires on bonding pads of a semiconductor chip, placing the structure in an electrolytic solution such that free ends of the conductive wires opposite the pads are exposed outside the solution, attaching a conductive plate to the free ends of the wires, and electroplating a surface layer on the wires except for the free ends. This strengthens the wires while permitting the free ends to contact solder joints that are subsequently formed between the wires and a printed circuit board.

A major drawback of these techniques is that solder joints or conductive adhesives connect the wires to the substrates.

Solder joints exhibit increased electrical resistance as well as cracks and voids over time due to fatigue from thermo-mechanical stresses. In addition, the solder is typically a tin-lead alloy and lead-based materials are becoming far less popular due to environmental concerns over disposing of toxic materials and leaching of toxic materials into ground water supplies.

Conductive adhesives do not normally form a metallurgical interface in the classical sense. Rather, the electrically conductive path is through conductive filler particles that contact one another. Moisture penetration through the polymer binder may induce corrosion or oxidation of the conductive filler particles resulting in an unstable electrical connection. Furthermore, the polymer binder and the conductive filler particles may degrade leading to an unstable electrical connection. Thus, conductive adhesives may have adequate mechanical strength but poor electrical characteristics.

Recent introduction of grid array packaging (e.g., ball grid arrays), chip size packages (CSP) and flip-chip packages using high density interconnect substrates are relentlessly driving increased printed circuit board density and increasing the demands upon semiconductor chip assemblies.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a support circuit that provides a low cost, high performance, high reliability package.

Another objective of the present invention is to provide a convenient, cost-effective method for manufacturing semiconductor chip assemblies as chip size packages, ball grid arrays or other structures.

The present invention accomplishes these objectives by providing an elongated wire that is wire bonded to the chip and plated to the support circuit.

In accordance with one aspect of the invention, a chip assembly includes a semiconductor chip attached to a support circuit. The chip includes a conductive pad and the support circuit includes a conductive trace. An elongated wire that electrically connects the pad to the trace is attached to the pad by a wire bond and attached to the trace by a plated connection joint.

Preferably, an electrically conductive path between and in contact with the pad and the trace includes the elongated wire and excludes solder and conductive adhesive. It is also preferred that the elongated wire is compressible in a direction normal to major surfaces of the chip and the support circuit, thereby providing vertical compliance between the chip and the support circuit.

In accordance with another aspect of the invention, a method of manufacturing the semiconductor chip assembly includes attaching the elongated wire to the pad with a ball bond formed by thermocompression or thermosonic wire bonding, positioning the elongated wire proximate to the trace, and then attaching the elongated wire to the trace with a connection joint formed by electroless plating.

The method may include inserting the elongated wire into a blind via in the support circuit and using the elongated wire to vertically support the chip after forming the ball bond and before forming the connection joint. Alternatively, the method may include inserting the elongated wire into a through-hole in the support circuit and using stand-offs to vertically support the chip after forming the ball bond and before forming the connection joint.

The method may also include underfilling an insulative adhesive between and in contact with the chip and the support circuit after forming the connection joint such that the adhesive surrounds the elongated wire and contacts the connection joint.

An advantage of the present invention is that the semiconductor chip assembly can be a flip-chip arrangement that need not include TAB leads, solder joints or conductive adhesives. Another advantage is that the assembly can be manufactured using conventional wire bonding equipment. Still another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1H are cross-sectional views of a method of manufacturing a semiconductor chip assembly in accordance with a first embodiment of the present invention.

Figure 1A:
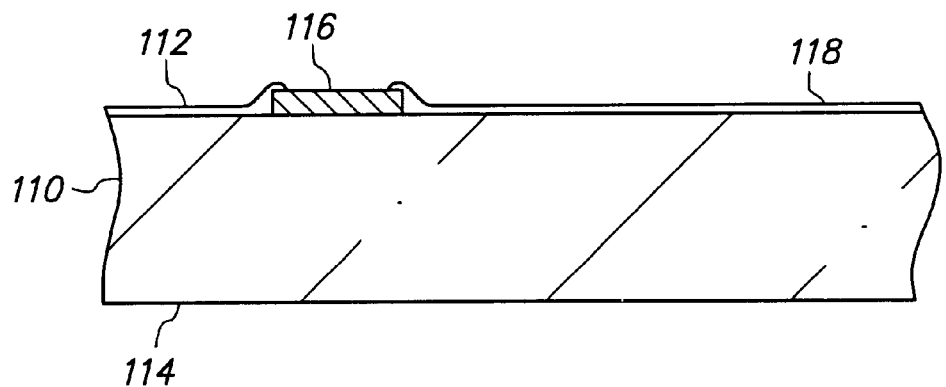
FIGS. 1A–1H are cross-sectional views showing a method of manufacturing a semiconductor chip assembly in accordance with a first embodiment of the present invention.

FIG. 1A is a cross-sectional view of semiconductor chip 110 in which various transistors, circuits, interconnect lines and the like are formed (not shown). Chip 110 includes upper surface 112 and lower surface 114. Upper surface 112 includes conductive pad 116 surrounded by passivation layer 118. Pad 116 is substantially aligned with passivation layer 118 so that upper surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has an aluminum base that serves as a surface layer. If desired, the aluminum base of pad 116 is cleaned by dipping chip 110 in a solution containing 0.005 M phosphoric acid at room temperature for 1 minute, native oxide on the aluminum base is removed by dipping chip 110 in 0.001 M $HNO_3$, and then chip 110 is rinsed in distilled water. Pad 116 has a length and width of 100 microns. Chip 110 includes many other pads on upper surface 112, and only pad 116 is shown for convenience of illustration.

Figure 1B:
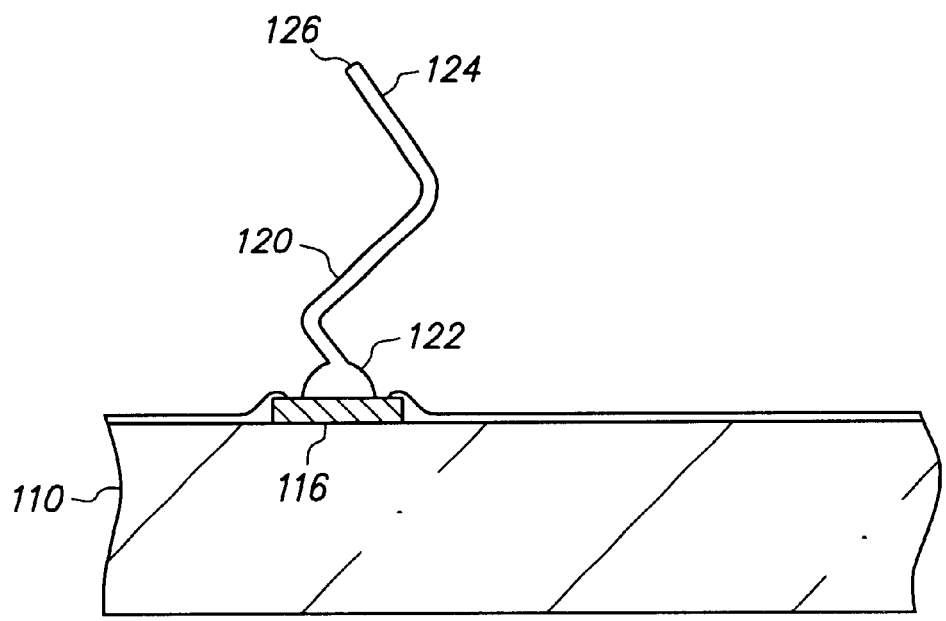

FIG. 1B is a cross-sectional view of semiconductor chip 110 with elongated wire 120 bonded thereto. Elongated wire 120 includes ball bond 122 and stub 124. Ball bond 122 is bonded to pad 116 and provides a robust mechanical and electrical connection to pad 116. Stub 124 extends above ball bond 122 and includes free end 126 opposite ball bond 122. Ball bond 122 has a barrel-shape with a diameter of 80 microns and a height of 50 microns and covers a central region of pad 116 without covering a peripheral region of pad 116. Stub 124 has an S-shape with a diameter of 25 microns, protrudes 300 microns above pad 116, and laterally spans 100 microns between the bends. Elongated wire 120 is composed of gold.

Elongated wire 120 is formed on pad 116 using thermosonic wire bonding. Initially a capillary and a wire ball are positioned above pad 116. The capillary has a conical shape and can be alumina, tungsten carbide, ceramic, artificial ruby or various refractory metals. The wire ball is gold and protrudes from the bottom of the capillary. The wire ball is formed at the end of a gold wire by applying thermal energy such as electronic flame-off or a hydrogen gas flame jet. The wire is fed from a spool through a clamp and a bore in the capillary. The clamp is closed to hold the wire in place. The wire ball is suitably sized so that ball bond 122 will have the desired shape and dimensions.

The capillary next moves downward towards pad 116 such that the wire ball contacts pad 116. The clamp opens before the movement begins so that the wire unwinds from its spool as the capillary moves. In addition, the capillary is heated to about 150 to 200° C. and provides horizontal ultrasonic oscillatory motions with a frequency of about 60 to 120 KHz. The combination of heat from the capillary and the recent flaming operation place the wire ball in a soft state which is easy to deform. However, the temperature of the wire ball does not damage chip 110.

The capillary moves further downward towards pad 116 such that the wire ball deforms into ball bond 122. Since the wire ball is still in a soft state, and the capillary exerts a downward force of about 25 to 45 grams while continuing to oscillate ultrasonically, the wire ball is readily deformed. The clamp remains open so that the wire continues to unwind from its spool as the capillary moves. Furthermore, the combination of heat, pressure and ultrasonic vibration forms a fused metallic joint between pad 116 and ball bond 122.

Thereafter, the capillary moves upward away from pad 116 while the clamp remains open, the wire slides through the capillary, and ball bond 122 begins to cool and solidify. In addition, the capillary moves horizontally in order to bend stub 124 into the desired S-shape. Finally, the wire is cut near the capillary to form free end 126 of stub 124. Thus, elongated wire 120 is wire bonded to pad 116 during a single thermosonic ball bonding operation.

Figure 1C:
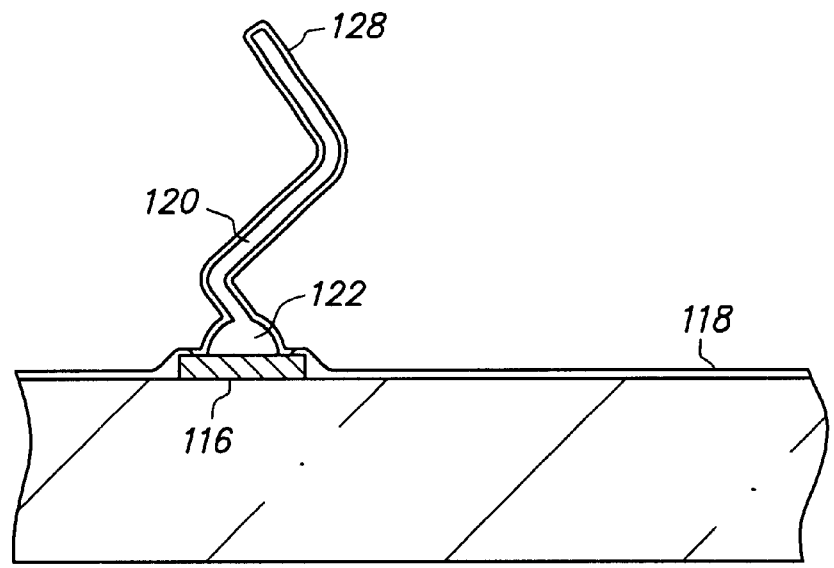

FIG. 1C is a cross-sectional view of electrolessly plated nickel surface layer 128 formed on elongated wire 120 and the peripheral region of pad 116 outside ball bond 122. Nickel surface layer 128 not only increases the rigidity of elongated wire 120, but also improves the connection between elongated wire 120 and pad 116 since it contacts the peripheral region of pad 116.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus.

Pad 116 has an aluminum base that should be relatively clean prior to depositing nickel surface layer 128. Since the aluminum base was recently exposed to phosphoric acid and $HNO_3$ to provide cleaning and oxide removal prior to the thermosonic ball bonding operation, these steps need not be repeated.

In order to initiate deposition of nickel surface layer 128, chip 110 and elongated wire 120 are dipped in an electroless nickel plating solution such as Enthone Enplate NI-424 at 85° C. The nickel is amorphous and does not deposit on passivation layer 118 and therefore a mask is not necessary. Since gold is catalytic to electroless nickel but the aluminum is not catalytic to electroless nickel, nickel surface layer 128 initially forms on elongated wire 120 without forming on the peripheral region of the aluminum base of pad 116 outside ball bond 122. However, shortly after nickel surface layer 128 begins to deposit on elongated wire 120, it contacts the peripheral region of the aluminum base of pad 116, thereby changing the electrochemical potential (voltage) of pad 116 by a small amount such as 0.2 volts. As a result, pad 116 becomes catalytic to electroless nickel, and nickel surface layer 128 simultaneously deposits on elongated wire 120 and the peripheral region of the aluminum base of pad 116. In addition, nickel adheres well to aluminum. Nickel surface layer 128 is primarily nickel and contains about 4 to 9 weight percentage phosphorus and is about 3 microns thick. Thereafter, chip 110 and nickel surface layer 128 are rinsed in distilled water.

Figure 1D:
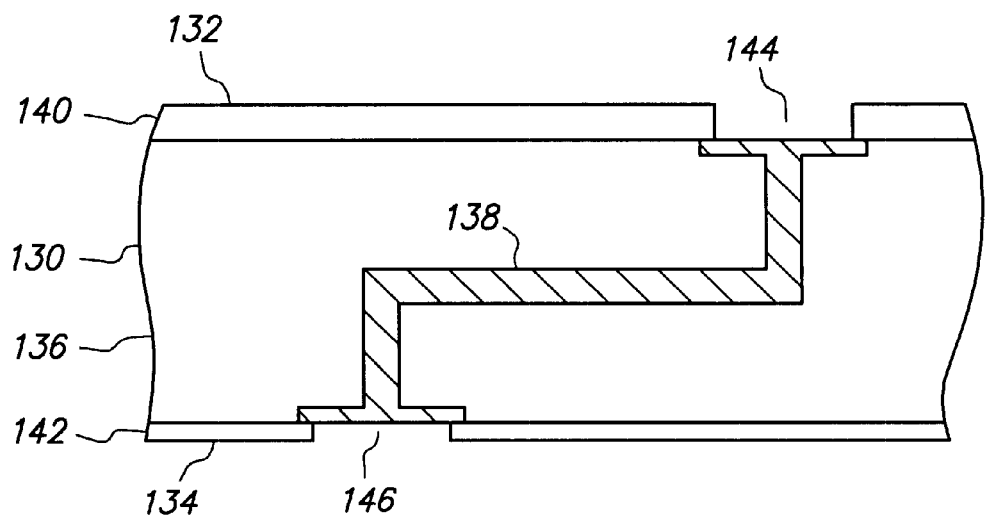
Figure 2:
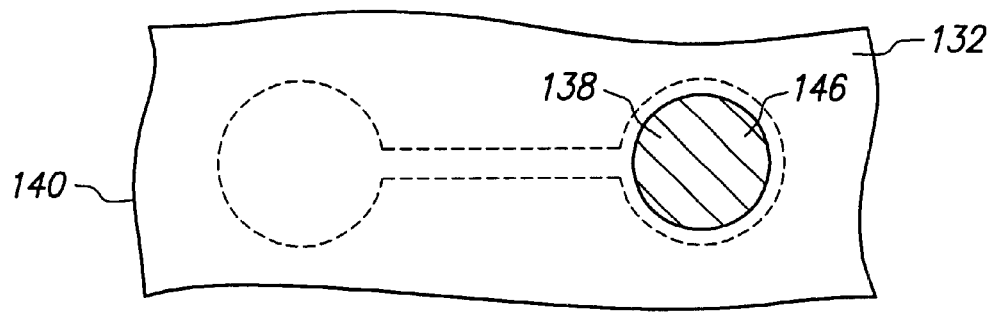
FIGS. 2 and 3 are top and bottom plan views, respectively, of the support circuit shown in FIG. 1D.
Figure 3:
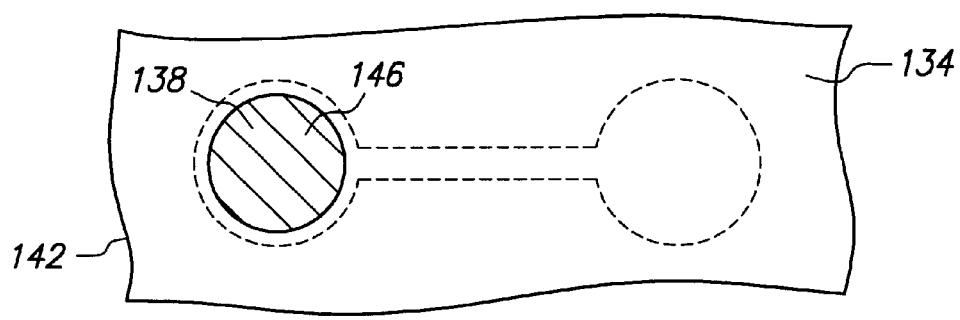

FIG. 1D is a cross-sectional view of support circuit 130 which is adapted to be mechanically and electrically coupled to chip 110 to form a semiconductor chip assembly. Support circuit 130 includes top surface 132 and bottom surface 134. Support circuit 130 also includes insulative base 136 and conductive trace 138. Conductive trace 138 is embedded in base 136 and may function as a signal, power or ground layer depending on the purpose of pad 116. Support circuit 130 also includes top solder mask 140 and bottom solder mask 142 laminated on the top and bottom surfaces, respectively, of insulative base 136. Top solder mask 140 includes an opening that exposes conductive trace 138 without exposing insulative base 136 (see FIG. 2), and bottom solder mask 142 includes an opening that exposes conductive trace 138 without exposing insulative base 136 (see FIG. 3). Thus, the exposed portions of conductive trace 138 are defined by solder masks 140 and 142. Since the openings in solder masks 140 and 142, respectively, extend from top and bottom surfaces 132 and 134, respectively, partially into but not cormpletely through support circuit 130, they constitute blind vias 144 and 146, respectively, in support circuit 130. Blind via 144 has insulative sidewalls provided by top solder mask 140 and extends from top surface 132 to conductive trace 138, and blind via 146 has insulative sidewalls provided by bottom solder mask 142 and extends from bottom surface 134 to conductive trace 138. In addition, blind via 144 is horizontally offset from blind via 146. As a result, conductive trace 138 provides horizontal routing (fan-in or fan-out) and vertical routing between blind vias 144 and 146.

Preferably, insulative base 136 is composed of an epoxy compound that includes an epoxy resin and glass fiber to increase rigidity, conductive trace 138 is composed of copper, and solder marks 140 and 142 are composed of epoxy. In addition, insulative base 136 has a thickness of 200 microns, conductive trace 138 has a width (outside enlarged circular regions exposed by the blind vias) of 25 microns, solder mask 140 has a thickness of 40 microns, solder mask 142 has a thickness of 20 microns, and blind vias 144 and 146 each have a diameter of 100 microns. Of course, other materials and dimensions are suitable.

Support circuit 130 includes other conductive traces in insulative base 136, and only conductive trace 138 is shown for convenience of illustration. The other conductive traces provide horizontal and vertical routing between corresponding blind vias in solder masks 140 and 142. In addition, the conductive traces are electrically isolated from one another by insulative base 136.

Support circuit 130 can be manufactured in a variety of ways using conventional techniques that are well-known to those skilled in the art.

Figure 1E:
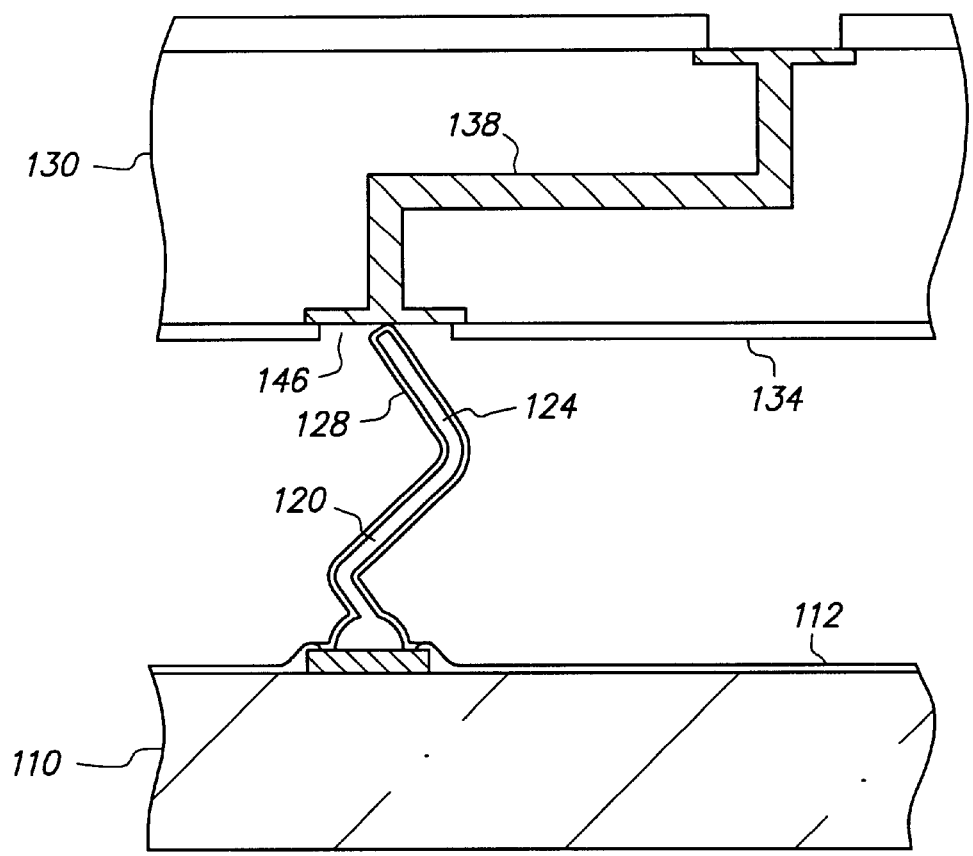

FIG. 1E is a cross-sectional view of chip 110 aligned with support circuit 130 such that elongated wire 120 is inserted inside blind via 146 and nickel surface layer 128 at free end 126 contacts the region of conductive trace 138 exposed by blind via 146. Chip 110 and support circuit 130 are aligned with one another using an automated pattern recognition system and held in place by a mechanical clamp. The mechanical clamp applies very low pressure on the order of 1 g/mm$^2$ that causes no appreciable bending of elongated wire 120. Since the 100 micron diameter of blind via 146 exceeds the combined 30 micron diameter of stub 124 and nickel surface layer 128, blind via 146 has ample space to receive stub 124 coated by nickel surface layer 128. Nickel surface layer 128 contacts a small portion of the region of conductive trace 138 exposed by blind via 146, however the majority of the region of conductive trace 138 exposed by blind via 146 remains exposed.

At this stage, chip 110 and support circuit 130 do not contact one another. Rather, upper surface 112 and bottom surface 134 reside in substantially parallel planes, face one another and are separated from one another by about 250 microns. In addition, chip 110 and support circuit 130 are neither mechanically nor electrically connected to one another. Instead, nickel surface layer 128 at free end 126 is held in loose unsecured contact with conductive trace 138 by a mechanical clamp (not shown). Although chip 110 is shown beneath support circuit 130 in FIGS. 1E–1G for ease of comparison with other figures, preferably the assembly is inverted in FIGS. 1E–1G such that chip 110 is positioned above support circuit 130. Furthermore, elongated wire 120 as strengthened by nickel surface layer 128 in combination with other elongated wires and nickel surface layers (not shown) between and in contact with corresponding pads (not shown) on chip 110 and conductive traces (not shown) on support circuit 130 are the only elements that provide vertical support for chip 110.

Figure 1F:
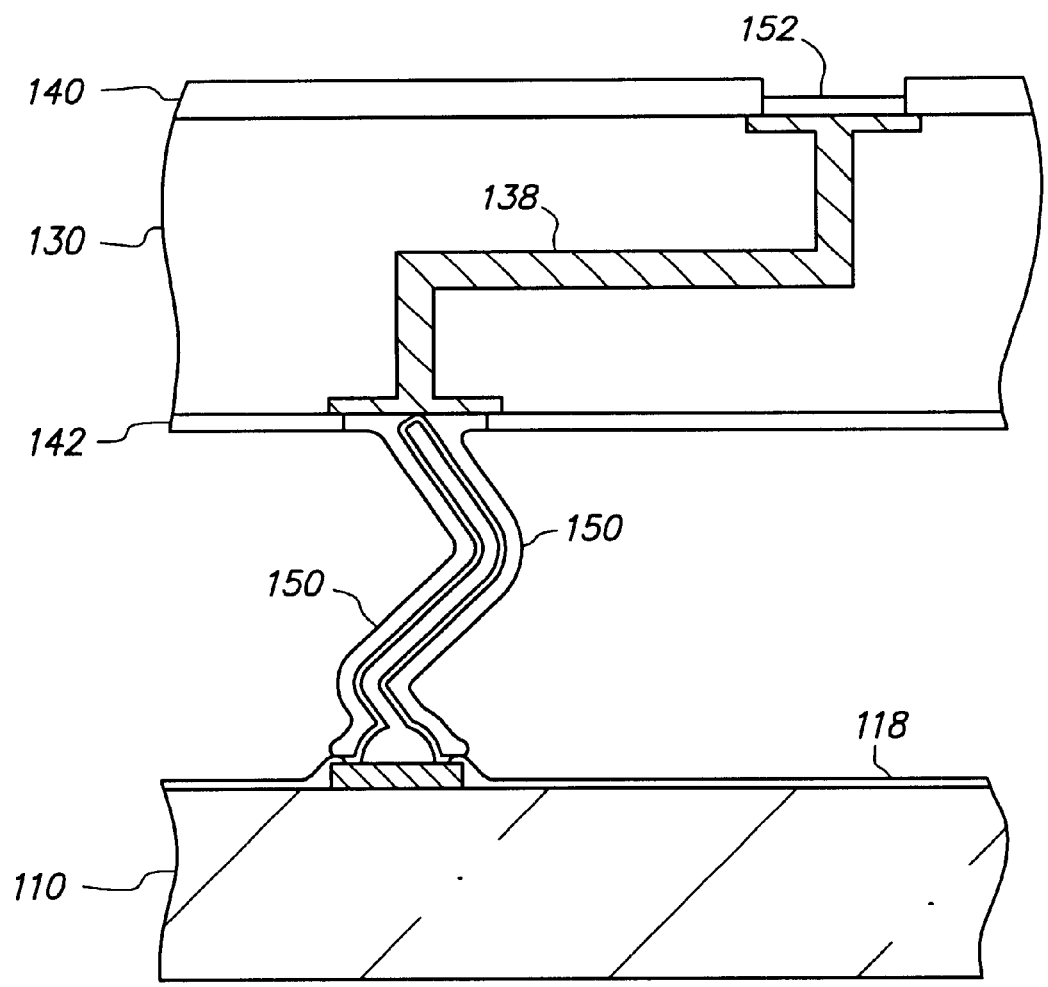

FIG. 1F is a cross-sectional view of the chip 110 mechanically and electrically connected to support circuit 130 by electrolessly plated connection joint 150.

Prior to forming connection joint 150, the assembly is dipped in an acid solution to clean the exposed copper. The acid solution can be inorganic, such as hydrochloric acid, sulfuric acid, phosphoric acid and combinations thereof, or organic, such as a carboxyl acid such as formic acid, acetic acid, propionic acid, citric acid and combinations thereof. The preferred acid is dilute hydrochloric acid. Thereafter, the assembly is rinsed in deionized water to remove the acid.

Thereafter, the assembly is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Once the assembly is submerged in the electroless nickel plating solution, nickel surface layer 128 and regions of conductive trace 138 that bound blind vias 144 and 146 are exposed to the nickel ions in the plating solution. As mentioned above, the nickel is amorphous and does not deposit on passivation layer 118 and therefore a mask is not necessary. Since nickel is catalytic to electroless nickel but copper is not catalytic to electroless nickel, connection joint 150 initially forms on nickel surface layer 128 without forming on conductive trace 138. However, shortly after connection joint 150 begins to deposit on nickel surface layer 128, it contacts the region of conductive trace 138 exposed by blind via 146, thereby changing the electrochemical potential of conductive trace 138 by a small amount such as 0.2 volts. As a result, conductive trace 138 becomes catalytic to electroless nickel, connection joint 150 simultaneously deposits on nickel surface layer 128 and the region of conductive trace 138 exposed by blind via 146, and solder pad 152 begins to deposit on the region of conductive trace 138 exposed by blind via 144. In this manner, connection joint 150 begins to plate (or 15 grow) on nickel surface layer 128 and the region of conductive trace 138 exposed by blind via 146, and solder pad 152 begins to plate (or grow) on the region of conductive trace 138 exposed by blind via 144.

The electroless nickel plating operation proceeds for a predetermined time period based on the plating rate and the desired thickness of connection joint 150 and solder pad 152. Therefore, endpoint detection is not necessary. At the completion of the electroless nickel plating operation, connection joint 150 and solder pad 152 are composed of nickel that is primarily nickel and contains about 4 to 9 weight percentage phosphorus and have a thickness of about 20 microns.

Thereafter, the assembly is removed from the electroless nickel plating solution and briefly submerged in an electroless gold plating solution such as is MacDermid PLANAR™ at 70° C. Advantageously, the gold deposits on the nickel without depositing on passivation layer 118 and therefore a mask is not necessary. The gold surface layer is relatively thin, with a thickness on the order of 0.3 microns. Thus, both connection joint 150 and solder pad 152 consist of a 20 micron thick buried nickel layer covered by a 0.3 micron thick gold surface layer. For convenience of illustration, the buried nickel layer and the gold surface layer are shown as a single layer. The buried nickel layer provides the primary mechanical and electrical connection for connection joint 150, and the gold surface layer provides a wettable surface for solder pad 152. To elaborate, the gold surface layer provides wetting for solder pad 152 when a solder ball (not shown) that is subsequently deposited on solder pad 152 is reflowed during the next level assembly but is of relatively little importance to connection joint 150. Thereafter, the assembly is rinsed in distilled water to remove contaminants, and the mechanical clamp is removed.

Thus, connection joint 150 fills the remaining space inside blind via 146, and solder pad 152 fills the lower 20 microns of blind via 144 while the upper 20 microns of blind via 144 remain unfilled. Connection joint 150 provides a robust, permanent electrical and mechanical connection between elongated wire 120 and conductive trace 138 inside blind via 146. Solder pad 152 provides a landing site inside blind via 144 for a subsequently deposited solder ball.

Figure 1G:
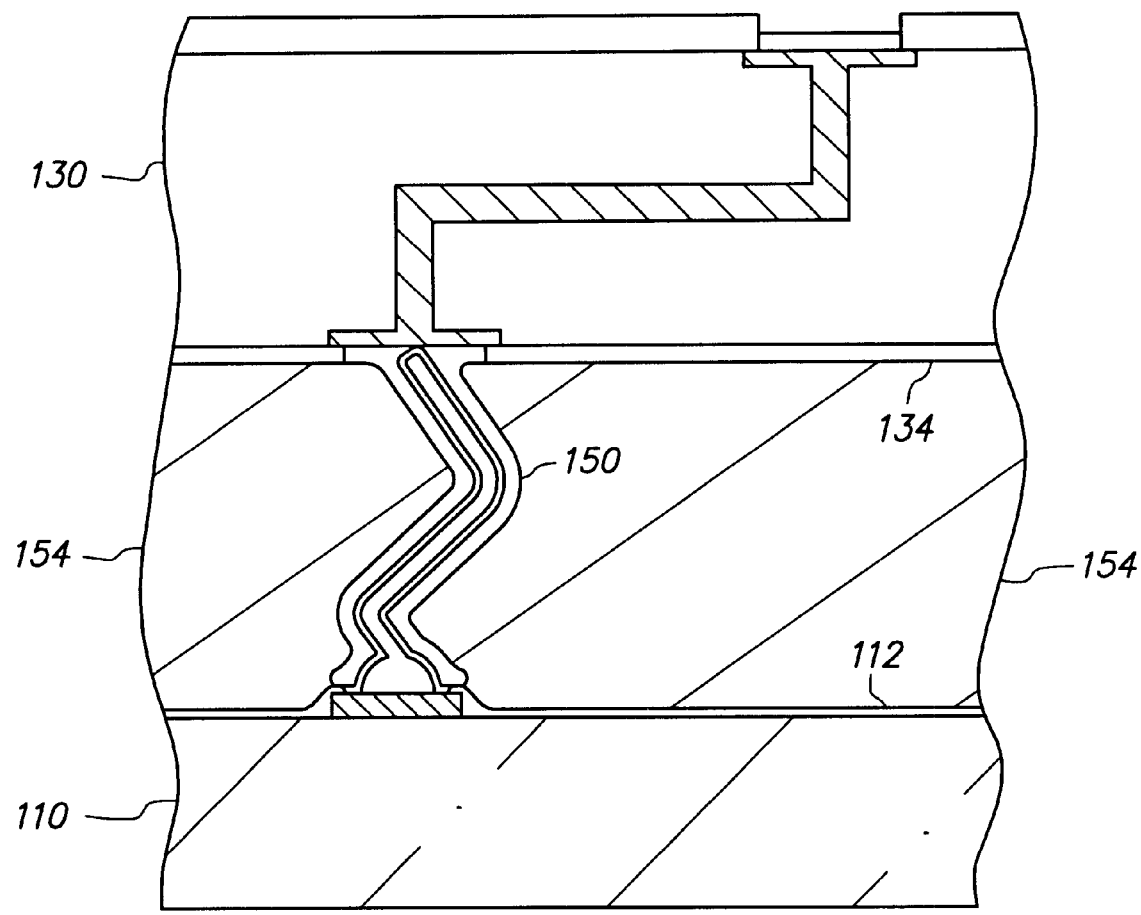

FIG. 1G is a cross-sectional view of insulative adhesive 154 underfilled between chip 110 and support circuit 130. Adhesive 154 contacts upper surface 112, bottom surface 134 and connection joint 150, thereby enhancing the mechanical attachment between chip 110 and support circut 130. In addition, adhesive 154 reduces stress on ball bond 122 and connection joint 150 due to thermal mismatch between chip 110 and support circuit 130 during normal operating conditions. Furthermore, adhesive 154 provides environmental protection for chip 110. Preferably, adhesive 154 is composed of an epoxy compound that includes an epoxy resin and a silica filler.

Figure 1H:
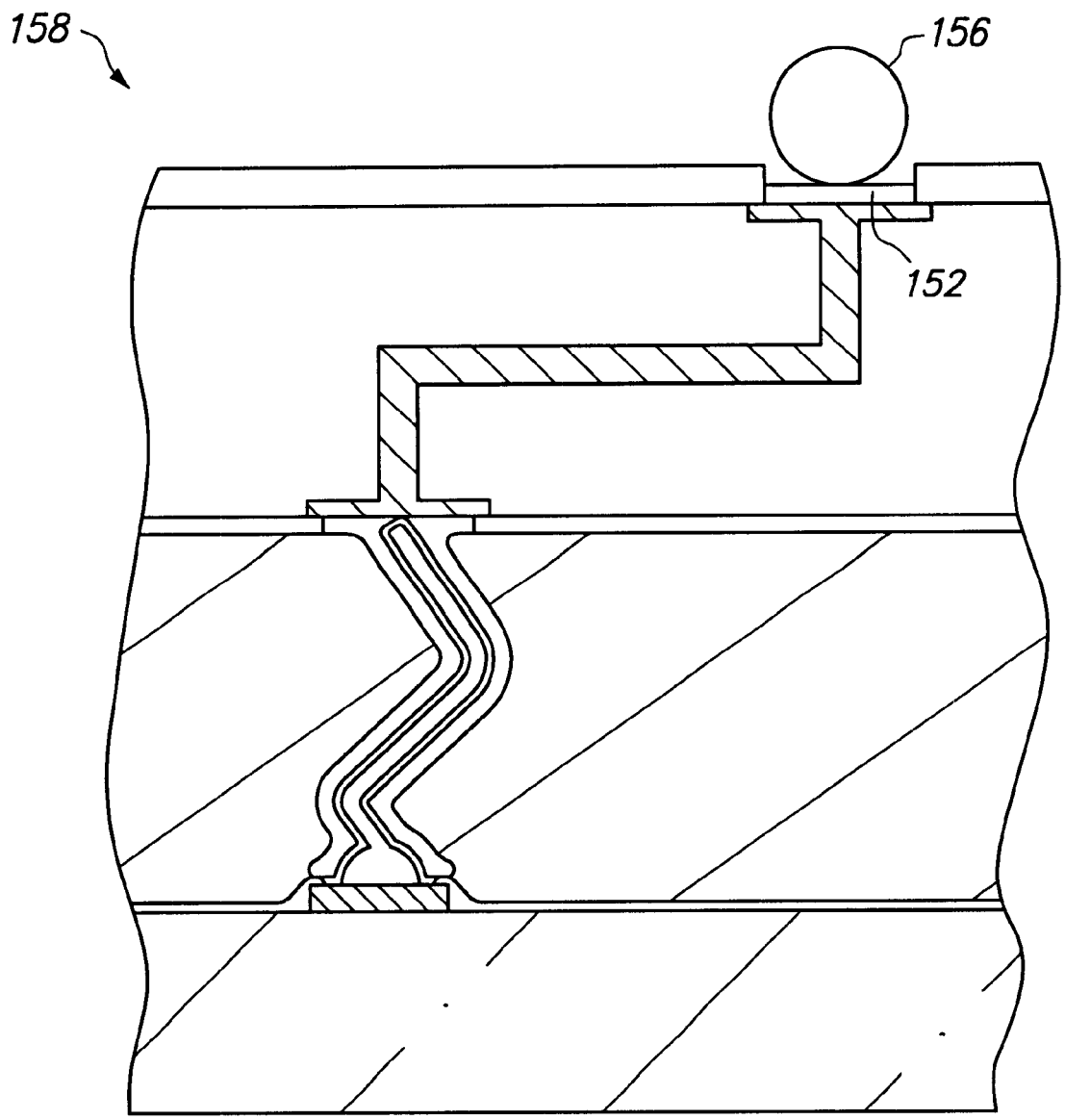

FIG. 1H is a cross-sectional view of final assembly 158 after solder ball 156 is disposed on solder pad 152 by printing or placement techniques. Solder ball 156 is used for electrical and mechanical connection to the next level assembly where it will be reflowed to form a solder joint.

Although not shown for convenience of illustration, assembly 158 includes a plurality of elongated wires that are bonded sequentially using thermosonic ball bonding to respective pads on chip 110, a plurality of connection joints that are simultaneously electrolessly plated inside respective blind vias in support circuit 130 to electrically and mechanically attach the elongated wires to respective conductive traces in support circuit 130, and a plurality of solder balls disposed on respective solder pads on the conductive traces.

Several advantages of assembly 158 may be noted. First, a flip-chip arrangement is achieved using a bumpless chip. Second, the combination of elongated wire 120, nickel surface layer 128 and connection joint 150 provide an electrically conductive path between and in contact with pad 116 and conductive trace 138 that excludes solder and conductive adhesive. Third, elongated wire 120 is compressible in the direction normal to upper surface 112 and bottom surface 134 due to elastic deformation of stub 124 thereby providing vertical compliance between chip 110 and support circuit 130. Fourth, chip 110 and support circuit 130 need not include gold. Fifth, it is relatively easy to underfill adhesive 154 between chip 110 and support circuit 130 due to the relatively long length of elongated wire 120. Sixth, the length of elongated wire 120 can be precisely controlled thereby improving uniformity and reducing susceptibility to non-planarities and dimensional and orientation variations. Seventh, the wire bonded and plated joints are relatively strong compared to solder joints. Eighth, the assembly can be readily manufactured as a chip size package.

FIGS. 4A–4G are cross-sectional views of a method of manufacturing a semiconductor chip assembly in accordance with a second embodiment of the present invention. In the second embodiment, the elongated wire is inserted into a plated through-hole in the support circuit to position the elongated wire proximate to the conductive trace before forming the connection joint. Therefore, the elongated wire does not provide vertical support for the chip and need not be mechanically reinforced by a nickel surface layer. Instead, a plurality of stand-offs on the chip provide vertical support for the chip. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, elongated wire 220 corresponds to elongated wire 120, etc.

Figure 4A:
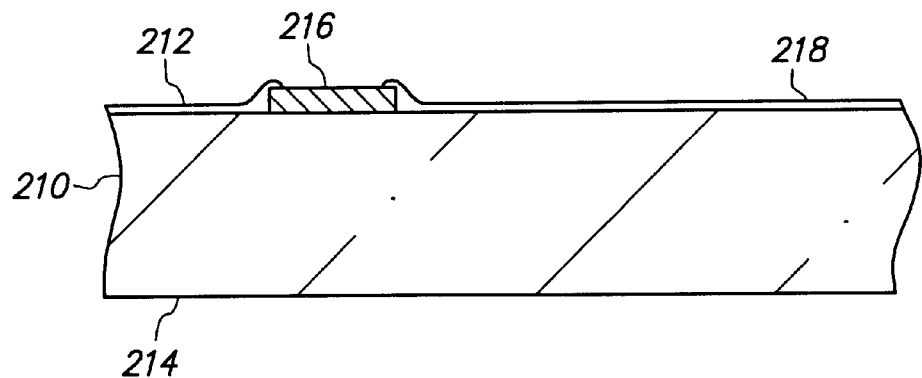
FIGS. 4A–4G are cross-sectional views showing a method of manufacturing a semiconductor chip assembly in accordance with a second embodiment of the present invention.
Figure 5:
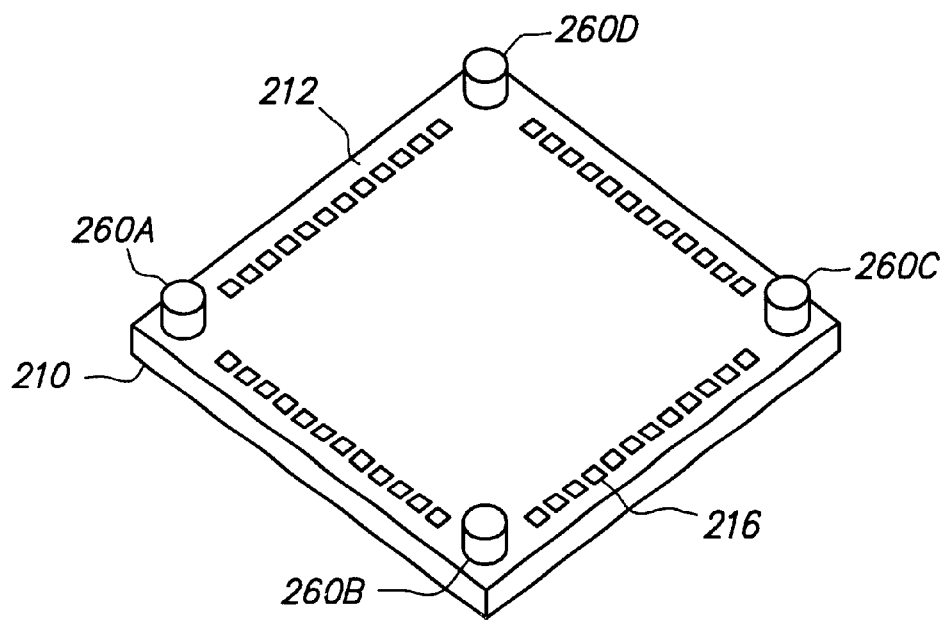
FIG. 5 is a zoomed-out perspective view of the chip shown FIG. 4A.

FIG. 4A is a cross-sectional view of semiconductor chip 210 that includes upper surface 212, lower surface 214, pad 216 and passivation layer 218. In addition, stand-offs 260A, 260B, 260C and 260D are attached to the four corners of upper surface 212 (see FIG. 5). Stand-offs 260A, 260B, 260C and 260D are initially dispensed as epoxy dots on the four corners of upper surface 212 and then cured. Stand-offs 260A, 260B, 260C and 260D are composed of an epoxy compound that includes an epoxy resin and a silica filler, have a diameter of 300 microns, protrude 200 microns above upper surface 212, and are positioned between orthogonal rows of pads adjacent to the four outer edges of upper surface 212.

Figure 4B:
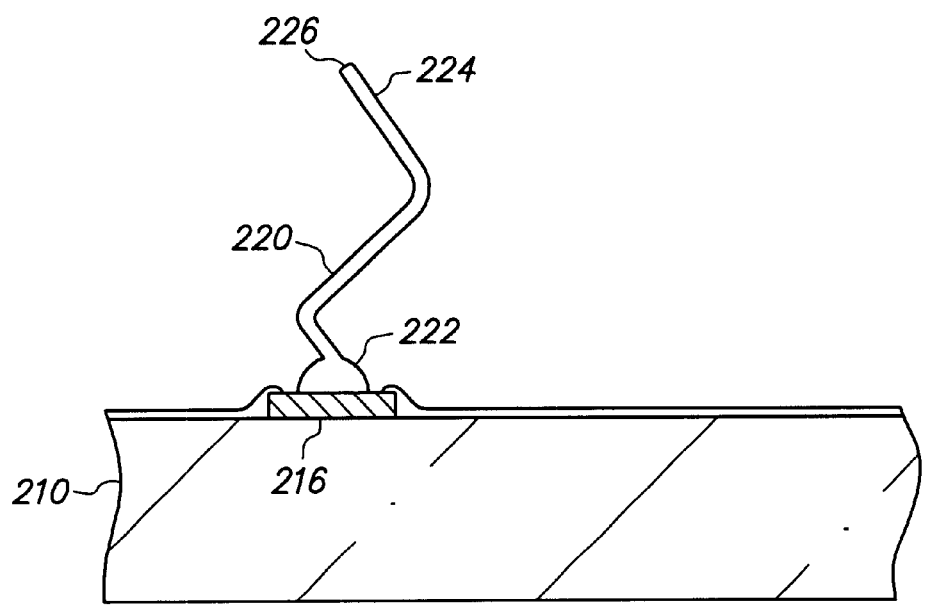

FIG. 4B is a cross-sectional view of semiconductor chip 210 with elongated wire 220 bonded thereto. Elongated wire 220 includes ball bond 222, stub 224 and free end 226. Elongated wire 220 is formed on pad 216 using thermosonic wire bonding.

Figure 4C:
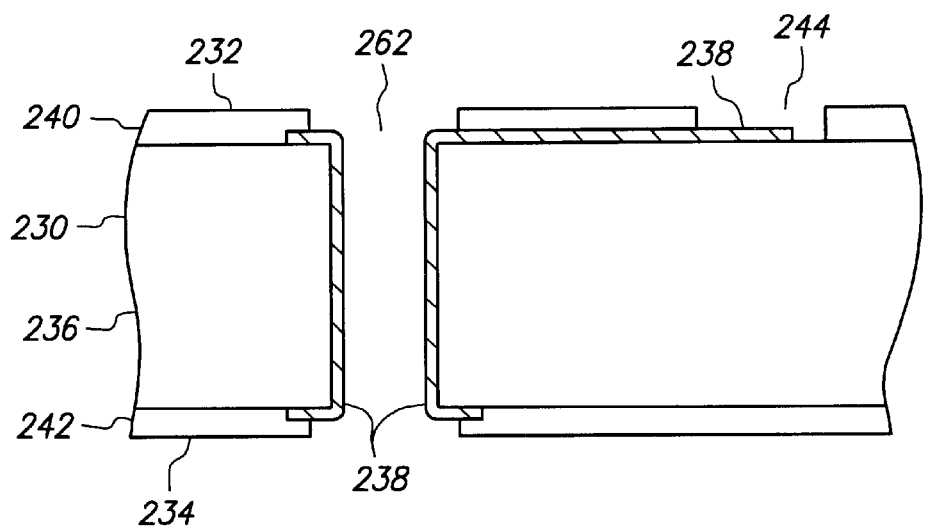
Figure 6:
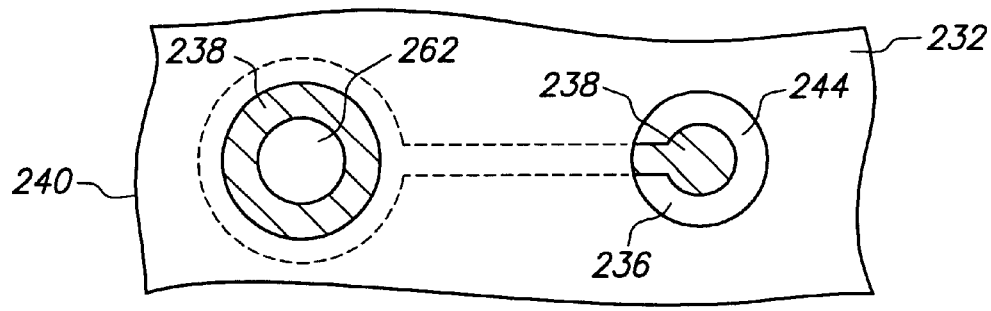
FIGS. 6 and 7 are top and bottom plan views, respectively, of the support circuit shown in FIG. 4C.
Figure 7:
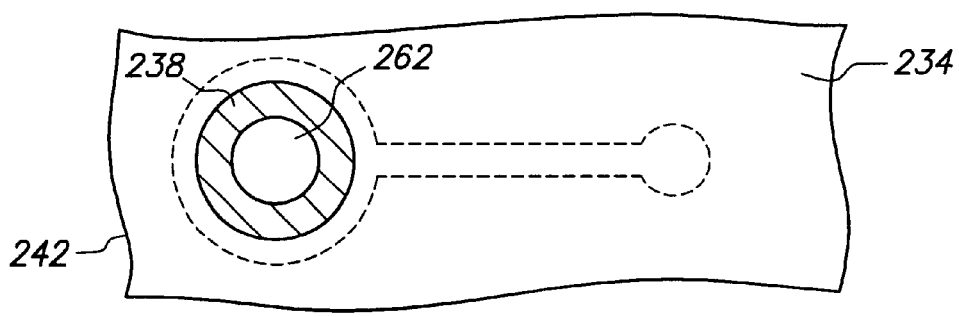

FIG. 4C is a cross-sectional view of support circuit 230 which is adapted to be mechanically and electrically coupled to chip 210 to form a semiconductor chip assembly. Support circuit 230 includes top surface 232, bottom surface 234, insulative base 236, conductive trace 238, top solder mask 240, bottom solder mask 242, blind via 244, and plated through-hole 262 that extends between top surface 232 and bottom surface 234. Top solder mask 240 includes a first opening that forms an upper unplated portion of plated through-hole 262 and exposes conductive trace 238 and a second opening that provides blind via 244 and exposes insulative base 236 and conductive trace 238 (see FIG. 6), and bottom solder mask 242 includes an opening that forms a lower unplated portion of plated through-hole 262 and exposes conductive trace 238 (see FIG. 7). Conductive trace 238 includes the plating on insulative base 236 at plated through-hole 262. As a result, conductive trace 238 provides horizontal and vertical routing between blind via 244 and the opening in solder mask 242.

Preferably, the plated portion of conductive trace 238 at plated through-hole 262 is composed of copper that is 10 microns thick, the diameter of the opening in insulative base 236 is 100 microns, the diameter of the first opening in solder mask 240 that surrounds plated through-hole 262 is 150 microns, the diameter of the second opening in solder mask 240 that provides blind via 244 is 150 microns, and the diameter of the opening in solder mask 242 is 150 microns. Therefore, the diameter of plated through-hole 262 inside insulative base 236 is 80 microns. It is also preferred that conductive trace 238 include enlarged circular regions with diameters of 200 microns on the top and bottom surfaces of insulative base 236 and adjacent to plated through-hole 262, and an enlarged circular region with a diameter of 100 microns that is exposed by and axially aligned with blind via 244. Therefore, insulative base 236 is exposed by blind via 244 but is not exposed by plated through-hole 262.

Figure 4D:
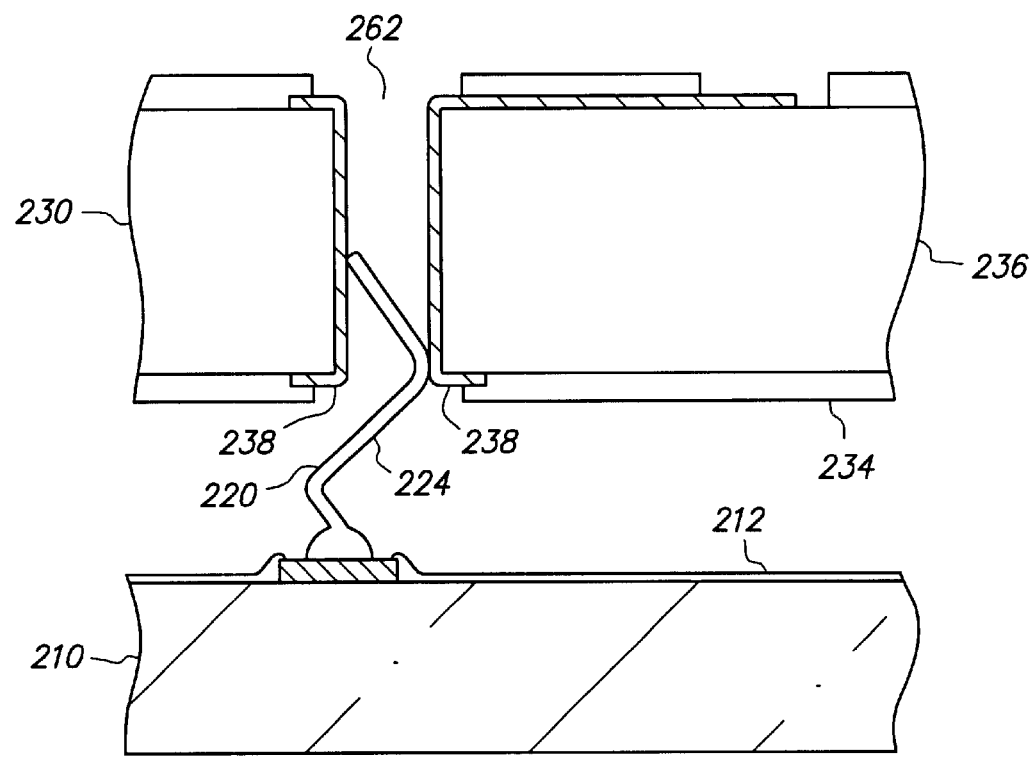
Figure 8:
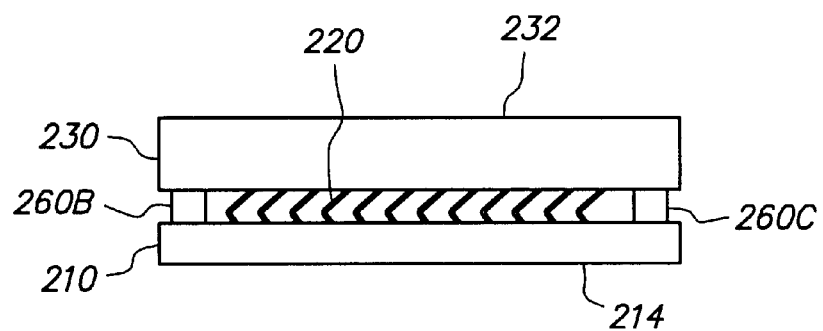
FIG. 8 is a zoomed-out cross-sectional view of the chip and support circuit shown in FIG. 4D.

FIG. 4D is a cross-sectional view of chip 210 aligned with support circuit 230 such that elongated wire 220 is inserted into plated through-hole 262 and stub 224 contacts the region of conductive trace 238 inside plated through-hole 262. Furthermore, stand-offs 260A, 260B, 260C and 260D make removable contact with the four corners of support circuit 230, thereby providing vertical support for chip 210 and separating chip 210 and support circuit 230 by 200 microns (see FIG. 8). Chip 210 and support circuit 230 are aligned with one another using an automated pattern recognition system and held in ,lace by a mechanical clamp. Since the 80 micron diameter of plated through-hole 262 inside insulative base 236 exceeds the 25 micron diameter of stub 224, plated through-hole 262 has ample space to receive stub 224. In addition, since stub 224 laterally (or horizontally) spans 100 microns before being inserted into plated through-hole 262, and after insertion vertically extends about 80 microns into plated through-hole 262, free end 226 and the bend adjacent thereto contact small regions of conductive trace 238 inside plated through-hole 262 and the majority of conductive trace 238 inside plated through-hole 262 remains exposed.

At this stage, chip 210 and support circuit 230 do not contact one another. Rather, upper surface 212 and bottom surface 234 reside in substantially parallel planes, face one another and are separated from one another by the 200 micron heights of stand-offs 260A, 260B, 260C and 260D. In addition, chip 210 and support circuit 230 are neither mechanically nor electrically connected to one another. Instead, elongated wire 220 is held in loose unsecured contact with conductive trace 238 inside plated through-hole 262, and stand-offs 260A, 260B, 260C and 260D are held in removable contact with support circuit 230. Although chip 210 is shown beneath support circuit 230 in FIGS. 4D–4F for ease of comparison with other figures, preferably the assembly is inverted in FIGS. 4D–4F such that chip 210 is positioned above support circuit 230. Furthermore, stand-offs 260A, 260B, 260C and 260D are the only elements that provide vertical support for chip 210.

Figure 4E:
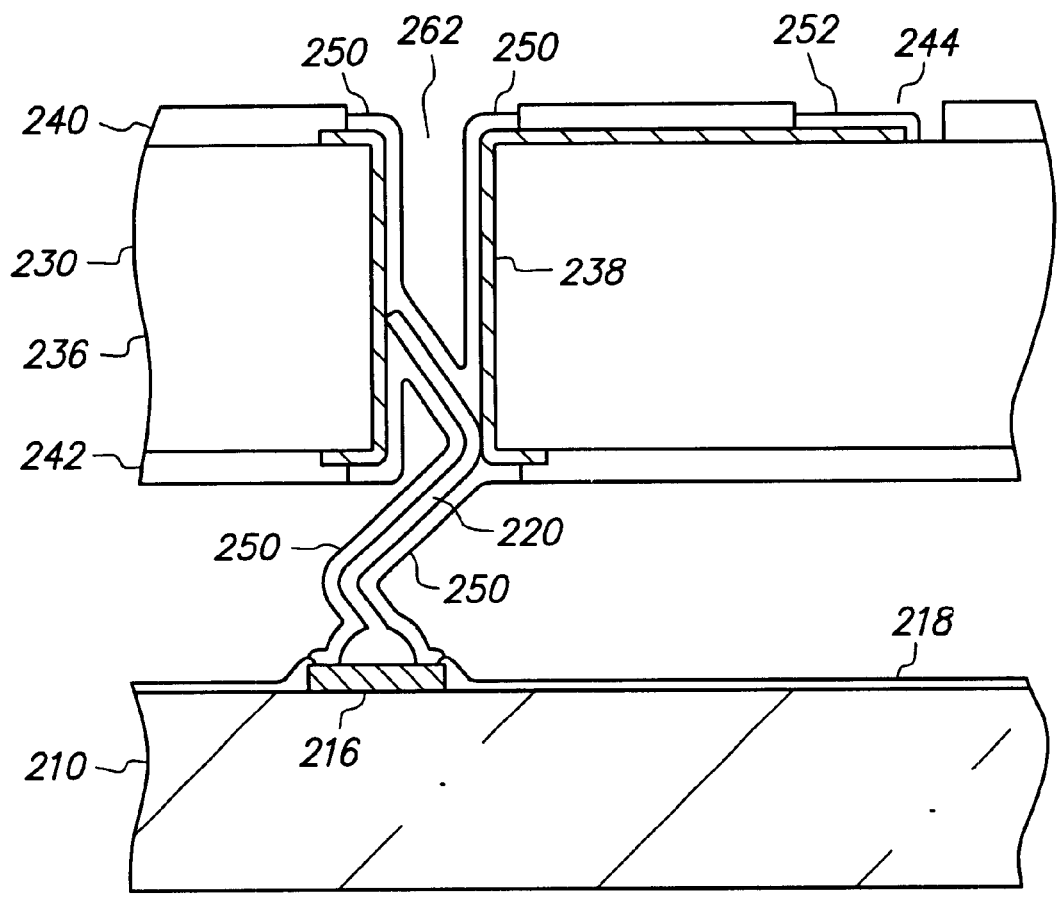

FIG. 4E is a cross-sectional view of the chip 210 mechanically and electrically connected to support circuit 230 by electrolessly plated connection joint 250. After cleaning the exposed copper, the assembly is submerged in an electroless nickel plating solution. Since gold is catalytic to electroless nickel but the copper, epoxy and passivation are not, connection joint 250 initially forms on elongated wire 220 without forming on passivation layer 218, insulative base 236, conductive trace 238, solder mask 240 or solder mask 242. However, shortly after connection joint 250 begins to deposit on elongated wire 220, it contacts the peripheral region of the aluminum base of pad 216, thereby changing the electrochemical potential (voltage) of pad 216 by a small amount such as 0.2 volts. Similarly, connection joint 250 also contacts conductive trace 238 inside plated through-hole 262, thereby changing the electrochemical potential of conductive trace 238 by a small amount such as 0.2 volts. As a result, pad 216 and conductive trace 238 become catalytic to electroless nickel, connection joint 250 simultaneously deposits on elongated wire 220, the peripheral region of the aluminum base of pad 216, and the portion of conductive trace 238 inside plated through-hole 262, and solder pad 252 deposits on the portion of conductive trace 238 exposed by blind via 244. After the electroless nickel plating operation proceeds for a predetermined time period, the assembly is removed from the electroless nickel plating solution and briefly submerged in an electroless gold plating solution to form a relatively thin gold surface layer on the electroless nickel. Connection joint 250 enhances the connection between elongated wire 220 and pad 216 and provides a robust, permanent electrical and mechanical connection between elongated wire 220 and conductive trace 238 inside plated through-hole 262, and solder pad 252 provides a landing site inside blind via 244 for a subsequently deposited solder ball.

Figure 4F:
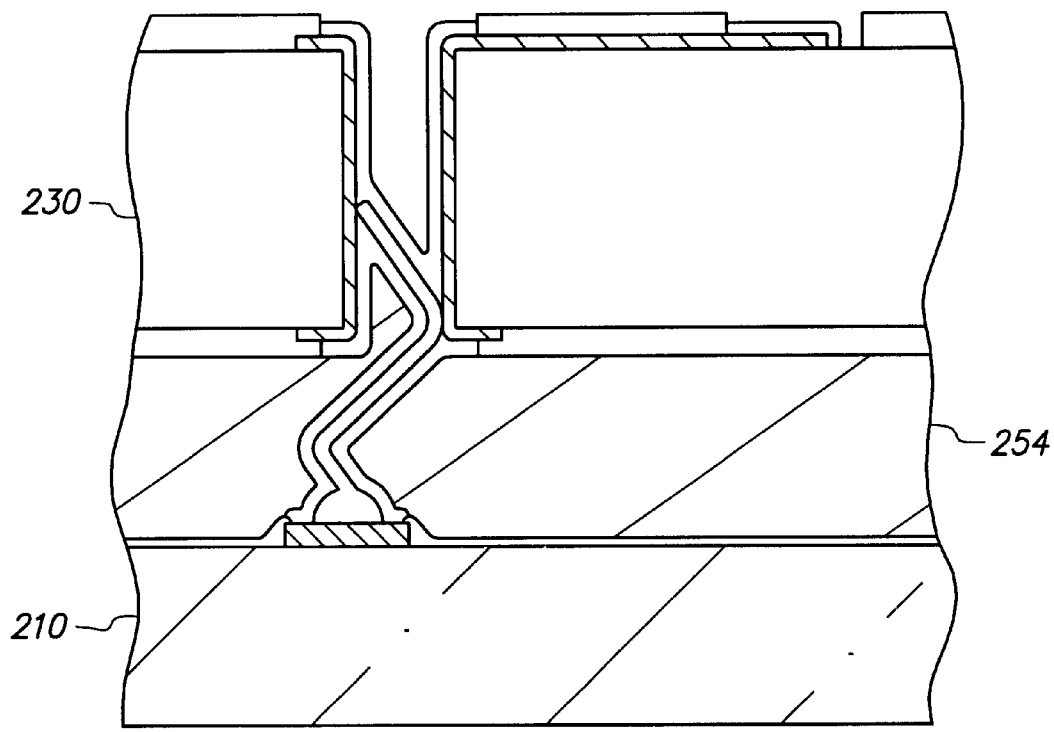

FIG. 4F is a cross-sectional view of insulative adhesive 254 underfilled between chip 210 and support circuit 230.

Figure 4G:
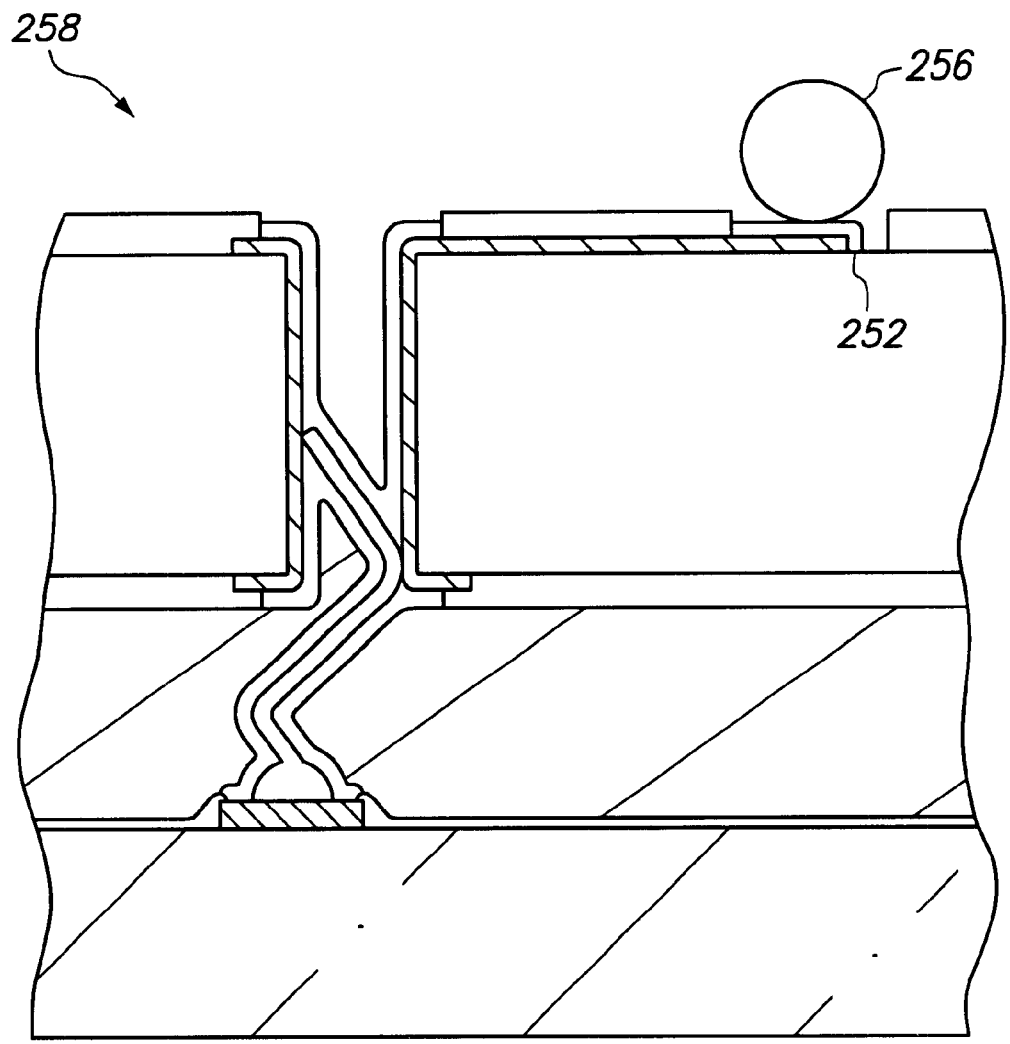

FIG. 4G is a cross-sectional view of final assembly 258 after solder ball 256 is disposed on solder pad 252.

Several advantages of assembly 258 may be noted. First, a flip-chip arrangement is achieved using a bumpless chip. Second, the combination of elongated wire 220 and connection joint 250 provide an electrically conductive path between and in contact with pad 216 and conductive trace 238 that excludes solder and conductive adhesive. Third, stand-offs 260A, 260B, 260C and 260D avoid the need for elongated wire 220 (and other elongated wires) to vertically support chip 210. Fourth, chip 210 and support circuit 230 need not include gold. Fifth, it is relatively easy to underfill adhesive 254 between chip 210 and support circuit 230 due to the relatively large heights of stand-offs 260A, 260B, 260C and 260D. Sixth, the heights of stand-offs 260A, 260B, 260C and 260D can be precisely controlled thereby improving uniformity and reducing susceptibility to non-planarities and dimensional and orientation variations. Seventh, the wire bonded and plated joints are relatively strong compared to solder joints. Eighth, the assembly can be readily manufactured as a chip size package.

The semiconductor chip assemblies described above are merely exemplary. Numerous other embodiments are contemplated.

For instance, the nickel surface layer, solder masks, blind vias, through-hole, stand-offs, underfilled adhesive, solder pad, and solder ball are optional. Furthermore, various features of the embodiments described above can be combined, such as using blind vias and stand-offs, using through-holes without stand-offs, and so on.

The pad can have numerous shapes including a flat rectangular shape and a bumped shape, and can be composed of various conductive metals. For instance, the aluminum base can be covered by a gold surface layer with an adhesion and/or barrier layer therebetween, or an electrolessly plated nickel surface layer, before the elongated wire is attached to the pad.

The stand-offs can be permanent of temporary. Permanent stand-offs such as epoxy dots can be initially affixed to the chip and subsequently make removable contact with the support circuit while the connection joint is formed, or initially affixed to the support circuit and subsequently make removable contact with the chip while the connection joint is formed. Temporary stand-offs such as teflon coated metal sticks can make removable contact with the chip and support circuit while the connection joint is formed and then be removed before the underfilled adhesive is applied.

The elongated wire can be attached to the pad by various wire bonding techniques including thermocompression bonding, thermosonic bonding, wedge bonding, and other approaches in which the wire is welded to the pad using a combination of heat, pressure and/or vibration without using material other than the materials of the wire and the pad. It is understood that incidental amounts of other materials such as surface preparation agents, reaction products and contaminants such as oxide coatings and the like may be present in or around the bond.

The elongated wire can be ball bonded to the pad by thermocompression or thermosonic wire bonding and composed of any conventional bonding wire material including gold, silver, copper, palladium, and alloys thereof. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. If desired, gold alloyed with 1 percent palladium raises the recrystallization temperature so that the fully annealed area above the ball bond resulting from the thermal source (such as electronic flame-off), called the heat-affected zone (HAZ), is extremely short, resulting in a short stub on the ball bond after the wire is broken from the ball bond with a simple upward vertical movement. Furthermore, aluminum alloyed with small amounts of silicon, magnesium or both has been proposed for thermosonic wire bonding.

The elongated wire can be straight and extend in a direction normal to the pad or be inclined at any desired angle by being bonded at the angle or being bent to the angle after bonding. Likewise, the elongated wire may be straight or curved. In either case, the elongated wire should be maintained a sufficient distance apart from adjacent elongated wires to avoid contact which would lead to a short circuit.

The support circuit can be single or mufti-layer printed circuit board, a lead frame, a tape, a glass panel, or a ceramic hybrid.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important.

The blind vias and through-hole can have a circular, ovular, square, rectangular or other shapes (as viewed from the top or bottom surface of the support circuit). Furthermore, the blind vias and through-hole can have sidewalls with a wide variety of shapes and slopes including vertical sidewalls, tapered sidewalls, continuous sidewalls and stepped sidewalls.

The conductive trace can have various shapes and sizes and can be various conductive metals including copper, gold, nickel, aluminum, tin, combiations thereof, and alloys thereof. Of common metallic materials, copper has especially low resistivity and cost, Furthermore, those skilled in the art will understand that in the context of a support circuit, a copper conductive trace is typically a copper alloy that is mostly copper but not pure elemental copper, such copperzirconium (99.9% copper), copper-silver-phosphonus-magnesium (99.7% copper), or copper-tin-iron-phosphorus (99.7% copper). The conductive trace may function as a signal, power or ground layer depending on the purpose of the associated chip pad. The conductive trace need not necessarily provide horizontal and vertical routing. Furthermore, the top portion of the conductive trace can be a ball, a pad, or a pillar (columnar post) that extends above, extends below, is aligned with or is covered by the top surface of the support circuit.

The conductive trace need not necessarily be disposed at the tops (or bottoms) of blind vias in the support circuit or in a through-hole in the support circuit. For instance, the conductive trace can be disposed at the bottom surface of the support circuit and contacted by the elongated wire and the connection joint at the bottom surface of the support circuit. As another example, the conductive trace can form the sidewalls of a blind via adjacent to the bottom surface. As still another example, the conductive trace can form the top surface of the support circuit and be adjacent to but not inside a through-hole in the support circuit. In this instance, the elongated wire can be inserted into the through-hole and extend above the top surface, and then the connection joint can be formed on the top surface and inside the through-hole.

The connection joint can be formed from a wide variety of materials including copper, gold, nickel, palladium, tin, alloys thereof, and combinations thereof, can be formed by a wide variety of plating processes including electroplating, electroless plating, and combinations thereof, and can have a wide variety of shapes and sizes. Further details regarding an electroplated connection joint are disclosed in U.S. Application Serial No. 09/643,212, filed Aug. 22, 2000 by Charles W.C. Lin entitled "Semiconductor Chip Assembly with Simultaneously Electroplated Contact Terminal and Connection Joint" which is incorporated by reference. Further details regarding an electrolessly plated connection joint are disclosed in U.S. Application Serial No. 09/643,214, filed Aug. 22, 2000 by Charles W.C. Lin entitled "Semiconductor Chip Assembly with Simultaneously Electrolessly Plated Contact Terminal and Connection Joint" which is incorporated by reference.

The connection joint can be formed by electroplating as long as a plating bus is connected to the conductive trace. However, after the connection joint is formed, the plating bus would be disconnected from the conductive trace by mechanical sawing, laser cutting, chemical etching, and combinations thereof.

The connection joint can be formed even if the elongated wire (and any surface layer thereon) does not contact the conductive trace. For instance, the elongated wire can be positioned proximate to but spaced from the conductive trace, and then a subsequent plating operation can form the connection joint on the elongated wire and the conductive trace thereby electrically and mechanically connecting them. An electroless plating operation can form an electroless metal portion on a catalytic elongated wire that eventually contacts a non-catalytic conductive trace and renders it catalytic, at which time the connection joint is simultaneously formed on the elongated wire and the conductive trace. An electroless plating operation can also form an electroless metal portion on a catalytic conductive trace that eventually contacts a non-catalytic elongated wire and renders it catalytic, at which time the connection joint is simultaneously formed on the elongated wire and the conductive trace. An electroless plating operation can also simultaneously form electroless metal portions on a catalytic elongated wire and a catalytic conductive trace that eventually contact one another and merge into a unitary connection joint. An electroplating operation can form an electroplated metal portion on the conductive trace during the initial stage and then, after the electroplated metal portion contacts the elongated wire, simultaneously form the connection joint on the conductive trace and the elongated wire.

The connection joint can consist of a single metal or include multiple metals. For instance, the connection joint can consist of electroless nickel. As another example, if the elongated wire (and any surface layer thereon) does not contact the conductive trace when the electroless plating begins, the connection joint can be formed with nickel during the initial stage and with gold during the final stage. In this instance, electroless nickel portions on the elongated wire and the conductive trace do not contact one another, and the electroless gold bridges the spaced electroless nickel portions. Advantageously, the nickel can be electrolessly plated at a relatively fast rate, and the gold is sufficiently ductile to absorb stress that might otherwise crack the nickel. As still another example, the connection joint can be formed with copper during the initial stage and then nickel, palladium or gold during the final stage to protect the copper from corrosion.

The connection joint may include a wide variety of plated metal layers. Likewise, the plating operation may deposit a wide variety of elemental metals or metal alloys including nickel, copper, gold, cobalt, platinum and various nickel alloys such as nickel-phosphorus, nickel-boron and nickel-cobalt. It is understood that plated metal, as used herein, encompasses elemental metals and metal alloys. Similarly, numerous activators can be used such as palladium, platinum and gold.

Numerous adhesives can be disposed between the chip and the support circuit after the connection joint is formed.

A soldering material or solder ball can be deposited over the conductive trace at or near the top surface of the support circuit by plating, printing, placement or other techniques if required for the next level assembly. However, the next level assembly may not require that the semiconductor chip assembly contain solder. For instance, in land grid array (LGA) packages, the soldering material is normally provided by the panel rather than the semiconductor chip assembly.

The "upper" and "lower" surfaces of the chip and the "top" and "bottom" surfaces of the support circuit do not depend on the orientation of the assembly, as will be readily apparent to those skilled in the art. For instance, the upper surface of the chip includes the pad and faces the bottom surface of the support circuit, and the top surface of the support circuit faces away from the chip, regardless of whether the assembly is inverted and/or mounted on a printed circuit board.

The working format can be a single chip, a wafer, a strip or a panel based on the manufacturing design. For instance, when the working format is a wafer, numerous semiconductor chip assemblies can be simultaneously batch manufactured on a single wafer and then separated from one another into chip size packages during singulation. As another example, when the working format is a strip (or reel-to-reel) form of the support circuit, the wafer is singulated into individual chips, the chips are individually aligned with support circuits on the strip, the connection joints are formed, and then the assemblies are separated from one another by cutting the strip. Assemblies manufactured using a strip can be chip size packages, ball grid arrays, or other structures. The wafer-based approach employs fewer steps and is less time consuming than the strip-based approach, however the strip-based approach is easier to control and has better dimensional stability than the wafer-based approach since aligning the elongated wires with the conductive traces involves a single chip and a single support circuit rather than the entire wafer and numerous support circuits.

Advantageously, the present invention provides a semiconductor chip assembly that is reliable and inexpensive. Conventional wire bonding equipment that is commonly used for many other packaging production steps can attach the elongated wire to the pad. This leverages the use of existing wire bonding equipment and eliminates the need for special equipment. Furthermore, mechanical and metallurgical coupling between the chip and the support circuit can be provided in a flip-chip arrangement without TAB, flip-chip bonding, photolithography, polishing, solder joints or conductive adhesives. As a result, the assembly of the present invention significantly enhances throughput, yield and performance characteristics compared to conventional packaging techniques. Moreover, the assembly of the present invention is well-suited for use with materials compatible with copper chip and lead-ree environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:
   providing a semiconductor chip and a support circuit, wherein the semiconductor chip includes a conductive pad, and the support circuit includes an insulative base and a conductive trace;
   wire bonding an elongated wire to the pad; and
   plating the elongated wire to the trace, wherein an electrically conductive path between and in contact with the pad and the trace includes the elongated wire and excludes solder and conductive adhesive.

2. The method of claim 1, wherein the wire bonding includes applying thermocompression or thermosonic bonding.

3. The method of claim 1, wherein the wire bonding includes applying wedge bonding.

4. The method of claim 1, wherein the plating includes applying electroplating.

5. The method of claim 1, wherein the plating includes applying electroless plating.

6. The method of claim 1, wherein the plating mechanically attaches the elongated wire to the trace inside a blind via in the support circuit.

7. The method of claim 1, wherein the elongated wire is compressible in a direction normal to the pad.

8. The method of claim 1, wherein the pad and the trace exclude solder and conductive adhesive.

9. The method of claim 1, wherein the pad includes nickel, the trace includes copper, and the elongated wire includes gold.

10. The method of claim 1, wherein the assembly is a chip size package.

11. A method of manufacturing a semiconductor chip assembly, comprising:

providing a semiconductor chip with upper and lower surfaces, wherein the upper surface includes a conductive pad;

providing a support circuit with top and bottom surfaces, wherein the support circuit includes an insulative base and a conductive trace;

forming a ball bond on the pad using thernocompression or thermosonic wire bonding thereby attaching an elongated wire to the pad; and forming an electrolessly plated joint that attaches the elongated wire to the trace while the upper surface faces the bottom surface, wherein an electrically conductive path between and in contact with the pad and the trace includes the elongated wire and excludes solder and conductive adhesive.

12. The method of claim 11, including contacting the elongated wire to the trace before forming the electrolessly plated joint.

13. The method of claim 11, including not contacting the elongated wire to the trace before forming the electrolessly plated joint.

14. The method of claim 11, including cutting the elongated wire at an end opposite the ball bond before forming the electrolessly plated joint.

15. The method of claim 11, including forming an electrolessly plated surface layer on the elongated wire after forming the ball bond and before forming the electrolessly plated joint.

16. The method of claim 11, including inserting the elongated wire into a blind via in the support circuit thereby positioning the elongated wire proximate to the trace after forming the ball bond and before forming the electrolessly plated joint.

17. The method of claim 11, wherein the elongated wire is compressible in a direction normal to the upper and bottom surfaces.

18. The method of claim 11, wherein the pad includes a surface layer that is primarily nickel, the trace is primarily copper, and the elongated wire is primarily gold.

19. The method of claim 11, wherein the assembly is devoid of TAB leads, solder joints and conductive adhesives.

20. The method of claim 11, wherein the assembly is a chip size package.

21. A method of manufacturing a semiconductor chip assembly, comprising the following steps in the sequence set forth:

providing a chip and a support circuit, wherein the chip includes a conductive pad and the support circuit includes an insulative base and a conductive trace;

positioning a capillary with a wire ball extending therefrom over the pad, wherein the wire ball is connected to a wire that is fed through the capillary;

moving the capillary towards the pad so that the wire ball contacts the pad and deforms into a ball bond and remains connected to the wire;

moving the capillary away from the ball bond and cutting the wire such that a remaining portion of the wire connected to the ball bond provides an elongated wire that extends above the pad; and forming an electrolessly plated joint that electrically connects the elongated wire to the trace, thereby transforming a loose unsecured relation between the elongated wire and the trace into a permanent electrical and mechanical connection between the elongated wire and the trace.

22. The method of claim 21, wherein the capillary forms the ball bond using thermocompression wire bonding.

23. The method of claim 21, wherein the capillary forms the ball bond using thermosonic wire bonding.

24. The method of claim 21, including inserting the elongated wire into a blind via in the support circuit thereby positioning the elongated wire proximate to the trace before forming the electrolessly plated joint.

25. The method of claim 21, including inserting the elongated wire into a through-hole in the support circuit thereby positioning the elongated wire proximate to the trace before forming the electrolessly plated joint.

26. The method of claim 21, including underfilling an insulative adhesive between and in contact with the chip and the support circuit after forming the electrolessly plated joint, wherein the adhesive surrounds the elongated wire and contacts the electrolessly plated joint.

27. The method of claim 21, wherein the elongated wire is compressible in a direction normal to the pad.

28. The method of claim 21, wherein the elongated wire extends above the pad at a height in the range of about 100 to 500 microns.

29. The method of claim 21, wherein an electrically conductive path between and in contact with the pad and the trace includes the elongated wire and excludes solder and conductive adhesive.

30. The method of claim 21, wherein the assembly is a chip size package.

31. A method of manufacturing a semiconductor chip assembly, comprising the following steps in the sequence set forth:

applying thermocompression or thermosonic wire bonding using a capillary that presses a wire ball against a conductive pad on a chip to form a ball bond that electrically and mechanically connects a wire to the pad;

cutting the wire to form an elongated wire that is mechanically and electrically connected to the pad by the ball bond and extends above the pad; and applying electroless plating to form a connection joint that electrically and mechanically connects the elongated wire to a conductive trace of a support circuit such that the elongated wire is secured to the trace for the first time.

32. The method of claim 31, including inserting the elongated wire into a blind via in the support circuit thereby positioning the elongated wire proximate to the trace, and then forming the connection joint inside the blind via.

33. The method of claim 31, including inserting the elongated wire into a through-hole in the support circuit thereby positioning the elongated wire proximate to the trace, and then forming the connection joint inside the through-hole.

34. The method of claim 31, wherein the pad, the trace, the elongated wire, and an electrically conductive path between and in contact with the pad and the trace that includes the elongated wire exclude solder and conductive adhesive.

35. The method of claim 31, wherein the elongated wire is compressible in a direction normal to the pad, thereby providing vertical compliance between the chip and the support circuit after forming the connection joint.

36. The method of claim 31, wherein the elongated wire and other elongated wires electrically connected to other conductive pads on the chip and any surface layers on the elongated wire and the other elongated wires provide all vertical support for the chip immediately before forming the connection joint.

37. The method of claim 31, wherein a plurality of insulative stand-offs between and in contact with the chip and the support circuit provide vertical support for the chip immediately before forming the connection joint.

38. The method of claim 37, wherein the stand-offs are affixed to the chip and make removable contact with the support circuit.

39. The method of claim 37, wherein the stand-offs are affixed to the support circuit and make removable contact with the chip.

40. The method of claim 37, wherein the stand-offs make removable contact with the chip and the support circuit.

41. A method of manufacturing a semiconductor chip assembly, comprising the following steps in the sequence set forth:

applying thermocompression or thermosonic wire bonding using a capillary that presses a first wire ball against a first conductive pad on a chip to form a first ball bond that electrically and mechanically connects a first wire to the first pad;

cutting the first wire to form a first elongated wire that is mechanically and electrically connected to the first pad by the first ball bond and extends above the first pad;

applying thermocompression or thermosonic wire bonding using the capillary that presses a second wire ball against a second conductive pad on the chip to form a second ball bond that electrically and mechanically connects a second wire to the second pad;

cutting the second wire to form a second elongated wire that is mechanically and electrically connected to the second pad by the second ball bond and extends above the second pad; and applying electroless plating to simultaneously form a first connection joint that electrically and mechanically connects the first elongated wire to a first conductive trace of a support circuit, thereby securing the first elongated wire to the first trace for the first time, and a second connection joint that electrically and mechanically connects the second elongated wire to a second conductive trace of the support circuit, thereby securing the second elongated wire to the second trace for the first time.

42. The method of claim 41, including inserting the first and second elongated wires into first and second blind vias in the support circuit thereby positioning the first and second elongated wires proximate to the first and second traces, and then forming the first and second connection joints inside the first and second blind vias.

43. The method of claim 41, including inserting the first and second elongated wires into first and second through-holes in the support circuit thereby positioning the first and second elongated wires proximate to the first and second traces, and then forming the first and second connection joints inside the first and second through-holes.

44. The method of claim 41, wherein the first and second pads, the first and second traces, the first and second elongated wires, and first and second electrically conductive paths between and in contact with the first and second pads and the first and second traces that include the first and second elongated wires exclude solder and conductive adhesive.

45. The method of claim 41, wherein the first and second elongated wires are compressible in a direction normal to the first and second pads, thereby providing vertical compliance between the chip and the support circuit after forming the first and second connection joints.

46. The method of claim 41, wherein the first and second elongated wires and other elongated wires electrically connected to other conductive pads on the chip and any surface layers on the first and second elongated wires and the other elongated wires provide all vertical support for the chip immediately before forming the connection joint.

47. The method of claim 41, wherein a plurality of insulative stand-offs between and in contact with the chip and the support circuit provide vertical support for the chip immediately before forming the connection joint.

48. The method of claim 47, wherein the stand-offs are affixed to the chip and make removable contact with the support circuit.

49. The method of claim 47, wherein the stand-offs are affixed to the support circuit and make removable contact with the chip.

50. The method of claim 47, wherein the stand-offs make removable contact with the chip and the support circuit.

51. A method of manufacturing a flip-chip assembly, comprising the following steps in the sequence set forth:

providing a chip and a support circuit, wherein the chip includes a conductive pad, and the support circuit includes an insulative base, a blind via and a conductive trace inside the blind via;

positioning a capillary with a wire ball extending therefrom over the pad, wherein the wire ball is connected to a wire that is fed through the capillary;

moving the capillary towards the pad so that the wire ball contacts the pad and deforms into a ball bond and remains connected to the wire;

moving the capillary away from the ball bond;

cutting the wire such that a remaining portion of the wire connected to the ball bond provides an elongated wire that extends above the pad;

positioning the chip and the support circuit such that the blind via faces the chip and the elongated wire is positioned inside the blind via; and forming an electrolessly plated joint that electrically and mechanically connects the elongated wire to the trace inside the blind via, thereby transforming a loose unsecured relation between the elongated wire and the trace into a permanent electrical and mechanical connection between the elongated wire and the trace.

52. The method of claim 51, including contacting the elongated wire to the trace inside the blind via, and then forming the electrolessly plated joint on the elongated wire and the trace.

53. The method of claim 51, including electrolessly plating a surface layer on the elongated wire, then contacting the surface layer to the trace inside the blind via, and then forming the electrolessly plated joint on the surface layer and the trace.

54. The method of claim 51, wherein the pad, the trace, the elongated wire, and an electrically conductive path between and in contact with the pad and the trace that includes the elongated wire exclude solder and conductive adhesive.

55. The method of claim 51, wherein the conductive pad is essentially coplanar with an upper surface of the chip.

56. The method of claim 51, wherein the chip is a bumpless chip.

57. The method of claim 51, wherein the elongated wire is compressible in a direction normal to the pad and the trace, thereby providing vertical compliance between the chip and the support circuit after forming the electrolessly plated joint.

58. The method of claim 51, wherein the pad has a surface that is primarily nickel, the trace is primarily copper and the elongated wire is primarily gold.

59. The method of claim 51, wherein the assembly is devoid of TAB leads, solder joints and conductive adhesives.

60. The method of claim 51, wherein the assembly is a chip size package.

61. A method of manufacturing a flip-chip assembly, comprising the following steps in the sequence set forth:
bonding a wire on a conductive pad of a semiconductor chip without using material other than the materials of the wire and the pad;
severing the wire to leave an elongated wire bonded to the pad and having a free end that extends above the pad;
positioning the chip so that the free end of the elongated wire is proximate to a conductive trace of a support circuit without being attached to the trace; and
attaching the free end of the elongated wire to the trace using plating, wherein an electrically conductive path between and in contact with the pad and the trace includes the elongated wire and excludes solder and conductive adhesive.

62. The method of claim 61, wherein the bonding includes thermocompression or thermosonic wire bonding.

63. The method of claim 61, wherein the attaching includes electroless plating.

64. The method of claim 61, wherein the free end of the elongated wire is inserted into a blind via in the support circuit thereby positioning the free end of the elongated wire proximate to the trace before the attaching.

65. The method of claim 61, wherein the elongated wire contacts the trace.

66. The method of claim 61, wherein the elongated wire does not contact the trace.

67. The method of claim 61, wherein the pad and the trace exclude solder and conductive adhesive.

68. The method of claim 61, wherein the elongated wire is compressible in a direction normal to major surfaces of the chip and the support circuit that face one another, thereby providing vertical compliance between the chip and the support circuit after the attaching.

69. The method of claim 61, wherein the assembly is devoid of TAB leads, solder joints and conductive adhesives.

70. The method of claim 61, wherein the assembly is a chip size package.

71. A method of manufacturing a semiconductor chip assembly, comprising:
providing a semiconductor chip with upper and lower surfaces, wherein the upper surface includes a conductive pad;
providing a support circuit with top and bottom surfaces, wherein the support circuit includes an insulative base and a conductive trace;
attaching an elongated wire to the chip using wire bonding, wherein the elongated wire includes a ball bond that contacts the pad and a first bend that is spaced from the pad; and then
forming a plated joint that attaches the elongated wire to the trace while the upper surface faces the bottom surface and the elongated wire includes the first bend, wherein an electrically conductive path between and in contact with the pad and the trace includes the elongated wire and excludes solder and conductive adhesive.

72. The method of claim 71, including contacting the elongated wire to the trace before forming the plated joint.

73. The method of claim 71, including not contacting the elongated wire to the trace before forming the plated joint.

74. The method of claim 71, including inserting the elongated wire into a blind via in the support circuit thereby positioning the elongated wire proximate to the trace, and then forming the plated joint inside the blind via.

75. The method of claim 71, including inserting the elongated wire into a through-hole in the support circuit thereby positioning the elongated wire proximate to the trace, and then forming the plated joint inside the through-hole.

76. The method of claim 71, including underfilling an insulative adhesive between and in contact with the chip and the support circuit after forming the plated joint, wherein the adhesive surrounds the elongated wire and contacts the plated joint.

77. The method of claim 71, wherein the pad and the trace exclude solder and conductive adhesive.

78. The method of claim 71, wherein a plurality of insulative stand-offs between and in contact with the chip and the support circuit provide vertical support for the chip immediately before forming the plated joint.

79. The method of claim 71, wherein the first bend is approximately 90 degrees.

80. The method of claim 71, wherein substantially all of the elongated wire is inclined relative to a direction normal to the upper and bottom surfaces.

81. The method of claim 71, wherein the elongated wire includes a second bend before and after forming the plated joint, the second bend is compressible in a direction normal to the upper and bottom surfaces, and the first and second bends are spaced from one another.

82. The method of claim 81, wherein the first bend is proximate to the pad and the second bend is proximate to the trace.

83. The method of claim 81, wherein the first bend is closer to the pad than to the trace, and the second bend is closer to the trace than to the pad.

84. The method of claim 81, wherein the first bend is closer to the pad than to the second bend, and the second bend is closer to the trace than to the first bend.

85. The method of claim 81, wherein the first and second bends face in opposite directions.

86. The method of claim 81, wherein the first and second bends are at similar angles.

87. The method of claim 81, wherein the first and second bends are approximately 90 degrees.

88. The method of claim 81, wherein the elongated wire consists of a stub and the ball bond, and the stub includes the first and second bends and has an S-shape.

89. The method of claim 81, wherein the elongated wire laterally spans 100 microns.

90. The method of claim 81, wherein substantially all of the elongated wire is inclined relative to a direction normal to the upper and bottom surfaces.

* * * * *